US009356636B1

(12) United States Patent
Mak et al.

(10) Patent No.: US 9,356,636 B1
(45) Date of Patent: May 31, 2016

(54) RF-TO-BB-CURRENT-REUSE WIDEBAND RECEIVER WITH PARALLEL N-PATH ACTIVE/PASSIVE MIXERS

(71) Applicant: UNIVERSITY OF MACAU, Taipa, Macau (CN)

(72) Inventors: Pui-In Mak, Macau (CN); Fujian Lin, Macau (CN); Rui Paulo Da Silva Martins, Macau (CN)

(73) Assignee: UNIVERSITY OF MACAU, Taipa, Macau (CN)

( * ) Notice: Subject to any disclaimer, the term of this patent is extended or adjusted under 35 U.S.C. 154(b) by 12 days.

(21) Appl. No.: 14/616,085

(22) Filed: Feb. 6, 2015

(51) Int. Cl.
| | |
|---|---|
| *H04B 1/10* | (2006.01) |
| *H04B 1/16* | (2006.01) |
| *H03D 7/14* | (2006.01) |
| *H03F 3/193* | (2006.01) |
| *H04B 1/12* | (2006.01) |

(52) U.S. Cl.
CPC ............. *H04B 1/16* (2013.01); *H03D 7/1441* (2013.01); *H03F 3/193* (2013.01); *H04B 1/123* (2013.01); *H03F 2200/451* (2013.01)

(58) Field of Classification Search
CPC ...... H04B 1/16; H04B 1/30; H04B 2001/307; H03F 3/193
USPC ........................ 455/296, 302, 307, 323, 324
See application file for complete search history.

(56) References Cited

U.S. PATENT DOCUMENTS

| | | | | |
|---|---|---|---|---|
| 2014/0057584 A1* | 2/2014 | Murphy | ................... | H04B 1/30 455/248.1 |
| 2015/0094004 A1* | 4/2015 | Vora | ....................... | H03D 7/166 455/114.1 |
| 2016/0100455 | * 4/2016 | Montalvo | .............. | H04W 88/10 375/345 |

OTHER PUBLICATIONS

Z. Ru, N. Moseley, E. Klumperink, and B. Nauta, "Digitally enhanced software-defined radio receiver robust to out-of-band interference," IEEE J. Solid-State Circuits, vol. 44, No. 12, pp. 3359-3374, Dec. 2009.

C. Andrews and A.C. Molnar, "A passive mixer-first receiver with digitally controlled and widely tunable RF interface," IEEE J. Solid-State Circuits, vol. 45, No. 12, pp. 2696-2708, Dec. 2010.

J. Borremans, G. Mandal, V. Giannini, B. Debaillie, M. Ingels, T. Sano, B. Verbruggen, and J. Craninckx, "A 40 nm CMOS 0.4-6 GHz receiver resilient to out-of-band blockers," IEEE J. Solid-State Circuits, vol. 46, No. 7, pp. 1659-1671, Jul. 2011.

(Continued)

*Primary Examiner* — Tuan Pham
(74) *Attorney, Agent, or Firm* — Ladas & Parry LLP (57) ABSTRACT

A single-ended-input current-reuse wideband receiver comprising (1) a stacked Radio Frequency to Baseband (RF-to-BB) front-end with an 8-path active mixer realizing RF amplification, harmonic-recombination (HR) down-conversion, and BB filtering in the current domain for better linearity and power efficiency; (2) a feedforward 8-path passive mixer enabling LO-defined input impedance matching without external components, while offering frequency-translated bandpass filtering and noise cancelling; (3) a single-MOS pole-zero lowpass filter (LPF) permitting both RF and BB filtering at low voltage headroom consumption, while easing the tradeoff between the in-/out-of-band linearity; and (4) a BB-only two-stage HR amplifier boosting the $3^{rd}$ and $5^{th}$ harmonic rejection ratios ($HRR_{3,5}$) with low hardware intricacy.

21 Claims, 10 Drawing Sheets

(56) References Cited

OTHER PUBLICATIONS

C. Andrews, et al., "A wideband receiver with resonant multi-phase LO and current reuse harmonic rejection baseband," IEEE J. Solid-State Circuits, vol. 48, pp. 1188-1198, May 2013.

A. Ghaffari et al., "Tunable high-Q N-path band-pass filters: modeling and verification," IEEE J. Solid-State Circuits, vol. 46, No. 5, pp. 998-1010, May 2011.

A. Mirzaei et al., "Architectural evolution of integrated M-phase high-Q bandpass filters," IEEE Trans. Circuits Syst. I, Reg. Papers, vol. 59, No. 1, pp. 52-65, Jan. 2012.

A. Mirzaei et al., "A 65 nm CMOS quad-band SAW-less receiver SoC for GSM/GPRS/EDGE," IEEE J. Solid-State Circuits, vol. 46, No. 4, pp. 950-964, Apr. 2011.

J. Borremans et al., "A 0.9V low-power 0.4-6GHz linear SDR receiver in 28nm CMOS," Symp. on VLSI Circuits, Dig. Tech. Papers, pp. 146-147, Jun. 2013.

D. Murphy, et al., "A blocker-tolerant, noise-canceling receiver suitable for wideband wireless applications," IEEE J. Solid-State Circuits, vol. 47, pp. 2943-2963, Dec. 2012.

S. Blaakmeer et al., "The BLIXER, a wideband balun LNA-I/Q-mixer topology," IEEE J. Solid-State Circuits, vol. 43, pp. 2706-2715, Dec. 2008.

V. Giannini, et al., "A 2-mm2 0.1-5 GHz software-defined radio receiver in 45-nm CMOS," IEEE J. Solid-State Circuits, vol. 44, No. 23, pp. 3486-3498, Dec. 2009.

P.-I. Mak and R. P. Martins, "A 0.46-mm2 4-dB NF unified receiver front-end for full-band mobile TV in 65-nm CMOS," IEEE J. Solid-State Circuits, vol. 46, No. 9, pp. 1970-1984, Sep. 2011.

Darvishi, et al., "Widely tunable 4th order switched Gm-C band-pass filter based on N-path filters," IEEE J. Solid-State Circuits, vol. 47, No. 12, pp. 3105-3119, Dec. 2012.

Darvishi et al., "Design of active N-path filters," IEEE J. Solid-State Circuits, vol. 48, No. 12, pp. 2962-2976, Dec. 2013.

F. Bruccoleri, E.Klumperink, and B.Nauta, "Wide-band CMOS low-noise amplifier exploiting thermal noise canceling," IEEE J. Solid-State Circuits, vol. 39, No. 2, pp. 275-282, Feb. 2004.

A. Pirola et al., "Current-mode, WCDMA channel filter with in-band noise shaping," IEEE J. Solid-State Circuits, vol. 45, pp. 1770-1780, Sep. 2010.

J. Greenberg et al., "A 40 MHz-to-1 GHz fully integrated multistandard silicon tuner in 80-nm CMOS," IEEE J. Solid-State Circuits, vol. 48, pp. 2746-2761, Nov. 2013.

J. Park and B. Razavi, "A 20mW GSM/WCDMA receiver with RF channel selection," ISSCC Dig. Tech. Papers, pp. 356-357, Feb. 2014.

F. Lin, P.-I. Mak and R. P. Martins, "An RF-to-BB-Current-Reuse Wideband Receiver with Parallel N-Path Active/Passive Mixers and a Single-MOS Pole-Zero LPF," IEEE ISSCC Dig. Tech. Papers, pp. 74-75, Feb. 2014.

\* cited by examiner

TABLE I
CHIP SUMMARY AND BENCHMARK WITH RECENT PASSIVE-MIXER-BASED RXS.

|  | This Work and [19] | JSSC'13 [4] | VLSI'13 [8] | ISSCC'12 [9] | ISSCC'09 [1] |
|---|---|---|---|---|---|
| RX Architecture | Current-Reuse RF Front-End + Feedforward Passive Mixer | Passive Mixer + BB LNA | RF LNA + Passive Mixer + $G_m$-C + Op-Amp | 2-Path Noise-Cancelling + Passive-Mixer + OpAmp | RF LNA + Passive Mixer + Op-Amp |
| Downconversion | Active // Passive | Passive | Passive | Passive | Passive |
| RF Input Style | Single-Ended | Single-Ended | Differential | Single-Ended | Differential |
| RF Range (GHz) | 0.15 to 0.85 | 0.7 to 1.6 (8-phase path) | 0.4 to 3 (8-phase path) | 0.08 to 2.7 | 0.4 to 0.9 |
| Power (mW) @ RF | 10.6 @ 0.15GHz 16.2 @ 0.85GHz | 10~12 @ 0.7GHz 10~12 @ 1.6GHz | 20 @ 0.4GHz 40 @ 3GHz | 37 @ 0.08GHz 70 @ 2.7GHz | 49 @ 0.4GHz 60 @ 0.9GHz |
| DSB NF (dB) | 4.6±0.9 | 10.5±2.5 | 1.8 to 2.4 | 1.9±0.4 | 4±0.5 |
| Ultimate Out-of-Band IIP3 (dBm) | +17.4 | +10 | +3 | +13.5 | +16 |
| Ultimate Out-of-Band IIP2 (dBm) | +61* +22/+21** | +26.6 | +85 (calibrated) | +54 | +56 |
| External Parts | Zero | Zero | Transformer | Zero | 2 Inductors and 1 Transformer |
| Active Area (mm²) | 0.55 | 2.9 (inc. VCOs) | ~0.5 (from Fig.) | 1.2 | 1 |
| BB Filtering Style | 2 Complex Poles + 2 Stopband Zeros (Current-Mode) | 1 Real Pole (Passive-RC) | 2 Real Poles (Active/Passive-RC) | 2 Real Poles (Active/Passive-RC) | 2 Real Poles (Active-RC) |
| $HRR_{3,5}$ (dB) | >53, >51 | 34, 34 | 70, 55 (calibrated) | 42, 45 | 60, 64 |
| 0dBm-Blocker NF (dB) | 12 (Δf = 240 MHz) | N/A | 14 (Δf = 80 MHz) | 4.1 (Δf = 80 MHz) | N/A |
| BB Bandwidth (MHz) | 9 | 20 | 0.5 to 50 | 2 | 12 |
| RF-to-IF Gain (dB) | 51±1 | 37 | 36 | 72 | 34.4±0.2 |
| Supply (V) | 1.2, 2.5 | 1.3 | 0.9 | 1.3 | 1.2 |
| CMOS Technology | 65 nm | 65 nm | 28 nm | 40 nm | 65 nm |

* Two tones at [$F_{LO}$+ΔF, $F_{LO}$+ΔF+1MHz]; ** Two tones at [$F_{LO}$-ΔF, ΔF+1MHz] / [$F_{LO}$+ΔF, ΔF-1MHz]

TABLE II
BENCHMARK WITH AN ACTIVE-MIXER-BASED MOBILE-TV RX.

|  | This Work and [19] | ISSCC'11 [12] |
|---|---|---|
| Downconversion | Active // Passive | Active |
| Power (mW) @ RF | 10.6 @ 0.15GHz 16.2 @ 0.85GHz | 43 @ 0.17GHz 50 @ 0.86GHz |
| External Parts | Zero | 1 Inductor |
| BB Filtering Style | 2 Complex Poles + 2 Stopband Zeros | 2 Complex Poles + 1 Real Pole |
| $HRR_{3,5}$ (dB) | >53, >51 | 35, 39 |
| RF-to-IF Gain (dB) | 51±1 | 35±1 |
| DSB NF (dB) | 4.6±0.9 | 4±0.2 |
| IIP3 (dBm) | −12 @ 51dB Gain (Δf=10MHz) | −3.4 @ 35dB Gain (Δf=10MHz) |
| Active Area (mm²) | 0.55 | 0.46 |
| Supply (V) | 1.2, 2.5 | 1.2, 2.5 |
| CMOS Technology | 65 nm | 65 nm |

Fig. 19

RF-TO-BB-CURRENT-REUSE WIDEBAND RECEIVER WITH PARALLEL N-PATH ACTIVE/PASSIVE MIXERS

BACKGROUND OF THE INVENTION

1. Field of the Invention

The present invention generally relates to frequency-flexible radio platforms for multi-band multi-standard wireless communications.

2. Related Art

Frequency-flexible radio platforms typically have wideband receivers that employ an N-path passive mixer for down-conversion. However, N-path passive-mixer-first receivers can suffer from a number of problems, including a tight, tradeoff between noise figure (NF), linearity, and power due to no radio frequency (RF) gain. There exists, therefore, a need to provide novel devices and methods that overcome the above-noted and other drawbacks of the existing technology.

SUMMARY OF THE INVENTION

As noted above, N-path passive-mixer-first receivers suffer from a tight tradeoff between NF, linearity, and power due to being without RF gain. The present application discloses and describes in one aspect an extensively-current-reuse wideband receiver making use of parallel N-path active/passive mixers. Among the notable features of the present invention are: (1) a stacked Radio Frequency to Baseband (RF-to-BB) front-end with an 8-path active mixer realizing RF amplification, harmonic-recombination (HR) down-conversion, and BB filtering in the current domain for better linearity and power efficiency; (2) a feedforward 8-path passive mixer enabling LO-defined input impedance matching without external components, while offering frequency-translated bandpass filtering and noise cancelling; (3) a single-MOS pole-zero lowpass filter (LPF) permitting both RF and BB filtering at low voltage headroom consumption, while easing the tradeoff between the in-/out-of-band linearity; and (4) a BB-only two-stage HR amplifier boosting the $3^{rd}$ and $5^{th}$ harmonic rejection ratios (HRR$_{3,5}$) with low hardware intricacy. Measurements over the television (TV) bands (0.15 to 0.85 GHz) manifest favorable NF (4.6±0.9 dB) and out-of-band IIP2/IIP3 (+61/+17.4 dBm) at small power (10.6 to 16.2 mW) and area (0.55 mm²). The HRR$_{2-6}$ are >51 dB without any calibration or tuning. The ultimate out-of-band P$_{-1dB}$ is >+2.5 dBm. The BB stopband rejection is >86 dB at 150-MHz offset.

According to an aspect of the invention, a single-ended-input current-reuse wideband receiver is provided, comprising: a stacked RF-to-BB front end adapted to receive an RF signal and having: a plurality of parallel N-path active mixers for processing the RF signal by performing amplification, harmonic-recombination down-conversion, and baseband (BB) filtering on the RF signal in a single combined cell to generate an N-phase BB signal; a plurality of parallel feedforward N-path passive mixers for performing input impedance matching, frequency-translated bandpass filtering, input biasing, and noise cancelling on the generated N-phase BB signal; a single-MOS pole-zero lowpass filter (LPF) to filter the N-phase BB signal and having a lowpass input impedance for high stopband rejection at low voltage headroom consumption; and a BB-only two-stage HR amplifier for performing two-step harmonic recombination of the filtered N-phase BB signal to enhance third and fifth harmonic rejection ratios without any gain scaling, performing BB current-to-voltage conversion and generating final differential BB I/Q outputs.

Further features and advantages of the present invention as well as the structure and operation of various embodiments of the present invention are described in detail below with reference to the accompanying drawings.

BRIEF DESCRIPTION OF THE DRAWINGS

The features and advantages of the present invention will be more readily understood from a detailed description of the exemplary embodiments taken in conjunction with the following figures, in which:

FIG. 1, which comprises FIGS. 1(a) and 1(b), shows examples of wideband receivers.

FIG. 2 shows an embodiment of the stacked RF-to-BB front-end of the present invention. The stacked RF-to-BB front end unifies RF amplification, down-conversion, and BB filtering in one combined cell. The N-path passive mixer assists the input impedance matching, RF filtering, and noise cancelling, without resorting to any external components.

FIG. 4, which comprises

FIG. 7, which comprises In FIG. 7(a) $M_{A[1]}$ and $M_{P[1]}$ are anti-phase to realize noise cancellation of $R_{sw}$; in FIG. 7(b) $M_{P[1]}$ and $M_{A[0]}$ are in-phase, rendering the noise of LPF a cancellable common-mode noise at the differential output. It is noted that $k_1$ and $k_2$ are constant representing the noise currents leak to $R_s$.

FIG. 8(a) is a circuit diagram illustrating a single-MOS pole-zero LPF and load (differential form), while

The invention will next be described in connection with certain exemplary embodiments; however, it should be clear to those skilled in the art that various modifications, additions, and subtractions can be made without departing from the spirit or scope of the claims.

DETAILED DESCRIPTION OF THE PREFERRED EMBODIMENTS

The following Section I provides an Introduction to the present invention.

I. Introduction

Frequency-flexible radios are low-cost platforms for multi-band multi-standard wireless communications. To eliminate (or minimize) the number of surface-acoustic-wave (SAW) filters, wideband receivers [1]-[4], as noted above, mostly favor the N-path passive mixer for down-conversion, due to its high linearity and bidirectional response-translational property. See, for example, the following publications: [1] Z. Ru, N. Moseley, E. Klumperink, and B. Nauta, "Digitally enhanced software-defined radio receiver robust to out-of-band interference," *IEEE J. Solid-State Circuits*, vol. 44, no. 12, pp. 3359-3374, December 2009; [2] C. Andrews and A. C. Molnar, "A passive mixer-first receiver with digitally controlled and widely tunable RF interface," *IEEE J. Solid-State Circuits*, vol. 45, no. 12, pp. 2696-2708, December 2010; [3] J. Borremans, G. Mandal, V. Giannini, B. Debaillie, M. Ingels, T. Sano, B. Verbruggen, and J. Craninckx, "A 40 nm CMOS 0.4-6 GHz receiver resilient to out-of-band blockers," *IEEE J. Solid-State Circuits*, vol. 46, no. 7, pp. 1659-1671, July 2011; and [4] C. Andrews, et al., "A wideband receiver with resonant multi-phase LO and current reuse harmonic rejection baseband," *IEEE J. Solid-State Circuits*, vol. 48, pp. 1188-1198, May 2013.

Depending on the first baseband (BB) node of the receiver that can be a virtual ground or a lowpass-RC (resistor-capacitor), the N-path passive mixer can be classified into current-mode [1], [2] or voltage-mode [3], [4] operation, respectively. For the former, the BB virtual ground is frequency-translated to RF, absorbing both the in-band signal and out-of-band interferers. As such, the signal amplification and channel selection can be delayed to BB. For the latter, the lowpass-RC at BB can be shifted to RF, offering a tunable bandpass response (also called N-path bandpass filter) that helps suppressing the out-of-band interferers [5]-[7]. See, for example, the following publications: [5] A. Ghaffari et al., "Tunable high-Q N-path band-pass filters: modeling and verification," *IEEE J. Solid-State Circuits*, vol. 46, no. 5, pp. 998-1010, May 2011; [6] A. Mirzaei et al., "Architectural evolution of integrated M-phase high-Q bandpass filters," *IEEE Trans. Circuits Syst. I, Reg. Papers*, vol. 59, no. 1, pp. 52-65, January 2012; and [7] A. Mirzaei et al., "A 65 nm CMOS quad-band SAW-less receiver SoC for GSM/GPRS/EDGE," *IEEE J. Solid-State Circuits*, vol. 46, no. 4, pp. 950-964, April 2011.

Figure 1A:
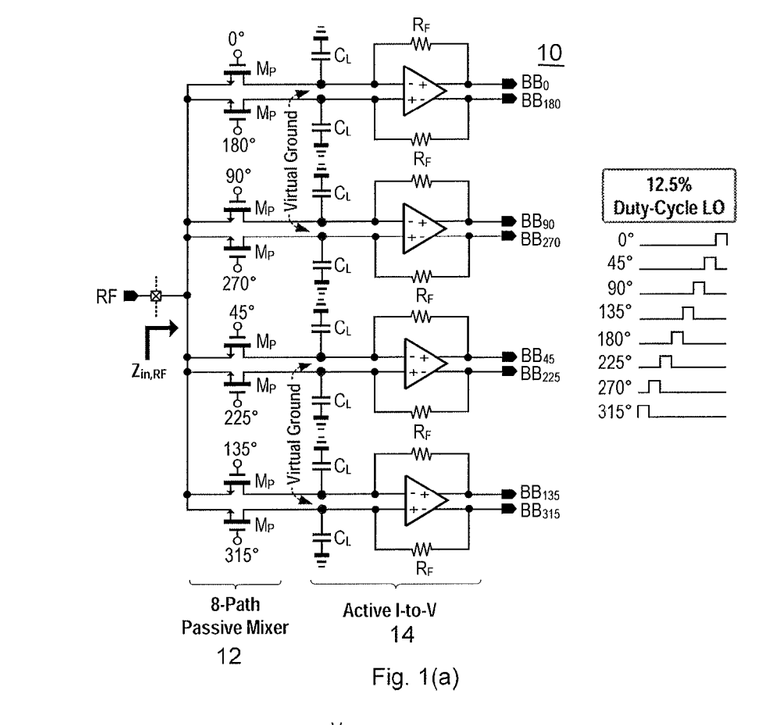
FIG. 1(a) shows an 8-path passive-mixer-first design with an active I-to-V BB component.

An example of the virtual-ground approach is the passive-mixer-first receiver [2]. See, for example, FIG. 1(a) of the present application, which shows a passive-mixer-first receiver 10 having two main components, an 8-path passive mixer 12 and an active current-to-voltage (I-to-V) component. The 8-path passive mixer 12 reduces the noise/harmonic folding and harmonic re-radiation at the RF port when compared with its 4-path counterpart. Input impedance matching is achieved with zero external components and is tunable by the BB circuitry. Expectedly, due to no RF gain, the out-of-band IIP3 (third order input intercept point) is high (+25 dBm), but demanding low-noise mixer, LO (local oscillator), and BB circuitry. They together bottleneck the power (37 to 70 mW over 0.1 to 2.4 GHz) for an affordable NF (noise figure) of 4±1 dB.

The power has been significantly cut down to 10 to 12 mW in [4], by operating the passive mixer in the voltage mode (i.e., having no virtual ground at BB and RF), and using resonant multi-phase LO (local oscillator) and current-reuse harmonic rejection at BB. Due to the limited tuning range of the resonant LO, the RF bandwidth is narrowed (0.7 to 3.2 GHz), while the NF (10.5±2.5 dB) and out-of-band IIP3 (+10 dBm) are both penalized as a tradeoff with the power. This compromise holds in advanced 28-nm CMOS (complementary metal oxide semiconductor) wideband receiver [8] (J. Borremans et al., "A 0.9V low-power 0.4-6 GHz linear SDR receiver in 28 nm CMOS," *Symp. on VLSI Circuits, Dig. Tech. Papers*, pp. 146-147, June 2013); it features a wideband LNA (low-noise amplifier) followed by an 8-path voltage-mode passive mixer plus G$_m$-C BB circuitry. This topology manages to squeeze the power (35 to 40 mW over 0.4 to 6 GHz) at low NF (1.8 to 3 dB), but is still short in terms of out-of-band IIP3 (+3 to +5 dBm). In fact, the dual-path receiver in [9] (D. Murphy, et al., "A blocker-tolerant, noise-canceling receiver suitable for wideband wireless applications," *IEEE J. Solid-State Circuits*, vol. 47, pp. 2943-2963, December 2012) combining the noise cancellation and virtual-ground approach balances better the NF (1.9 dB) and out-of-band IIP3 (+13.5 dBm). Even so, there is still room to improve its power (35.1 to 78 mW over 0.08 to 2.7 GHz) and area (1.2 mm$^2$) efficiencies.

Figure 1B:
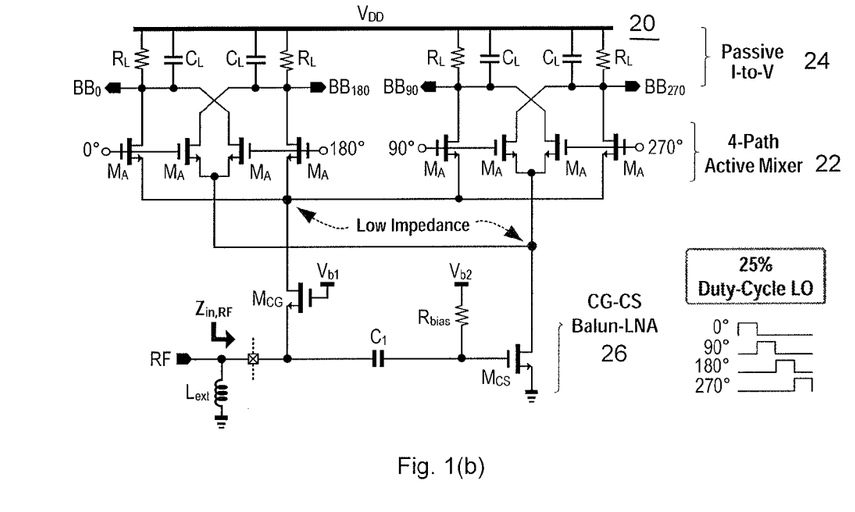
FIG. 1(b) shows a simplified balun-LNA-I/Q-mixer (Blixer) with a 4-path active mixer and a passive I-to-V BB component.

The balun-LNA-I/Q-mixer (Blixer) is discussed for example in [10] (S. Blaakmeer et al., " The B$_{LIXER}$, a wideband balun LNA-I/Q-mixer topology," *IEEE J. Solid-State Circuits*, vol. 43, pp. 2706-2715, December 2008). This is another alternative for wideband RF coverage at low power. FIG. 1(b) of the present application shows a simplified balun-LNA-I/Q-mixer (Blixer) 20 with a 4-path active mixer 22 and a passive I-to-V BB component 24. Its original structure stacks the 4-path (i.e., no harmonic rejection) active mixer 22 atop a balun-LNA 26 for current-reuse and current-mode signal processing. Together with the common-gate common-source (M$_{CG}$ and M$_{CS}$) input stage for noise cancellation, low NF (5±0.5 dB) and wide RF bandwidth (0.5 to 7 GHz) were achieved concurrently at small power (20 to 44 mW) and area (0.02 mm$^2$, no BB filter). However, owing to no RF filtering and lower linearity of active mixers, the out-of-band IIP3 (−3 dBm) is less competitive with [1]-[4]. In addition, a bulky external inductor L$_{ext}$ (40 nH) is entailed to attain a wideband input impedance match, while an AC-coupling network (R$_{bias}$ and C$_1$) is also entailed for biasing the CS transistor (M$_{CS}$); both induce in-band signal loss.

The present invention provides in one aspect a single-ended-input current-reuse wideband receiver with an N-path configuration to enhance performance. It targets the TV-band (0.15 to 0.85 GHz) applications such as mobile TV and IEEE 802.11af. For the former, a NF<5 dB is expected (no balun), and rejection of the $3^{rd}$ and $5^{th}$ LO harmonics is required due to in-band harmonic mixing (i.e., 0.15×3=0.45 GHz, 0.15× 5=0.75 GHz). The required out-of-band IIP3 is −8 dBm and IIP2 is 23 dBm [11] (V. Giannini, et al., "A 2-mm² 0.1-5 GHz software-defined radio receiver in 45-nm CMOS," *IEEE J. Solid-State Circuits*, vol. 44, no. 23, pp. 3486-3498, December 2009). The stacked RF-to-BB front-end is based on an 8-path active mixer, unifying not only RF amplification and down-conversion, but also high-order BB current-mode filtering in one branch. A feedforward 8-path passive mixer effectively realizes the input impedance matching, RF filtering, input biasing, and noise cancelling. The generated 8-phase BB signals allow two-step harmonic recombination (HR) solely at BB for enhancing the $3^{rd}$ and $5^{th}$ harmonic-rejection ratios ($HRR_{3,5}$). The fabricated 65-nm CMOS receiver shows balanced NF (4.6±0.9 dB) and out-of-band IIP3 (+17.4 dBm) with small power (10.6 to 16.2 mW) and area (0.55 mm², with BB LPF), without resorting from any external components.

Section II provides example embodiments of the receiver architecture of the present invention and details its circuit design. Experimental results are summarized in Section III, and conclusions are presented in Section IV.

II. Receiver Architecture and Circuit Details

A. Stacked RF-to-BB Front-end with Parallel N-Path Active/Passive Mixers

Figure 2:
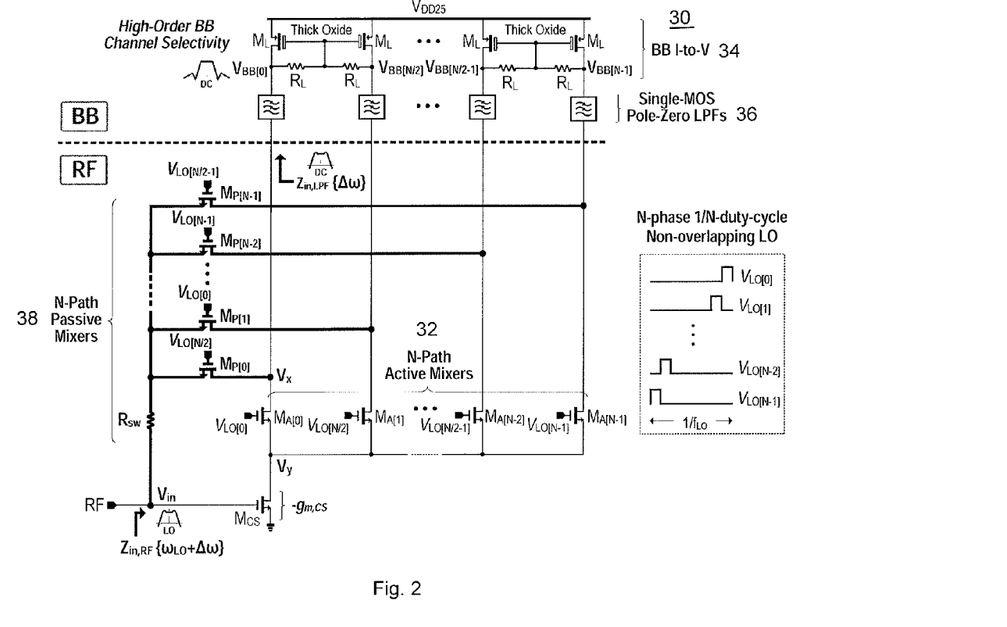

One embodiment of the stacked RF-to-BB front-end 30 of the present invention is depicted in FIG. 2. To cover the VHF-H and UHF bands (150 to 850 MHz) that have together 140% fractional bandwidth, N=8 alleviates harmonic mixing due to the critical $2^{nd}$ to $6^{th}$ LO harmonics. The $7^{th}$ LO harmonic is pushed out band (0.15×7=1.05 GHz), as well as the harmonic re-radiation that appears in the passive-mixer-first design. Another option is N=4 which is suitable for high-frequency applications, as harmonic mixing is no longer severe, and LO-path power can be saved during frequency division. In the analysis below, the symbol N is preserved for generality, since of course N is not limited to 4 or 8. N could also be, for example, 16. N=4 allows in-phase and quadrature-phase downconversion. N=8 or N=16 can increase the harmonic rejection at certain unwanted harmonics.

The receiver is headed by a CS (common source) amplifier ($M_{CS}$) serving as the LNA, which is the only RF V-to-I conversion. Its output and bias currents are then modulated by N-path active mixers 32 $[M_{A[0]} \ldots M_{A[N-1]}]$ driven by an N-phase 1/N-duty-cycle LO $[V_{LO[0]} \ldots V_{LO[N-1]}]$. A high-order current-mode LPF is stacked atop each mixer offering the channel selection before BB I-to-V conversion 34 via $R_L$. The current-mode LPF features a lowpass input impedance ($Z_{in,LPF}$) and is referred to a single-MOS pole-zero topology 36 to achieve high stopband rejection at low voltage headroom consumption. Similar to [3] and [12] (P.-I. Mak and R. P. Martins, "A 0.46-mm2 4-dB NF unified receiver front-end for full-band mobile TV in 65-nm CMOS," IEEE J. Solid-State Circuits, vol. 46, no. 9, pp. 1970-1984, September 2011), the I/O supply (e.g., 2.5 V in 65-nm CMOS) is useful to extend the transistor overdrives and 1-dB compression point ($P_{-1dB}$), while utilizing the thin-oxide and thick-oxide MOS for the RF and BB circuitry, respectively, and it can leverage the speed, 1/f noise, and gain (i.e., output conductance). The node-voltage trajectory check and protection circuitry similar to [3] have been applied which can ensure that there is no risk of device unreliability.

Figure 3:
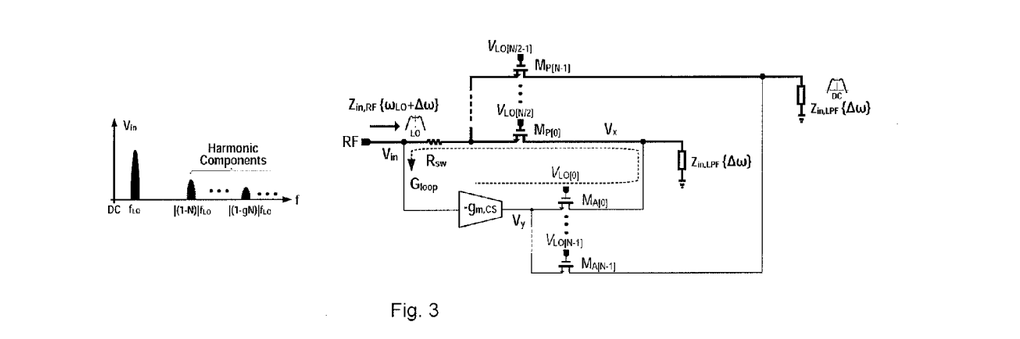
FIG. 3 is a functional view of the frequency-translational loop created by the N-path active/passive mixers.

The N-phase BB outputs $[V_{BB[0]} \ldots V_{BB[N-1]}]$ allow two-step HR solely at BB (outside the front-end), rejecting the critical LO harmonics up to N−2 (N is even) [1]. The LO is generated by a div-by-8 circuit optimized at typical 1.2 V. A feedforward N-path passive mixer 38 $[M_{P[0]} \ldots M_{P[N-1]}]$ driven by the same set of LO is added and its equivalent ON-resistance is denoted as $R_{sw}$. $[M_{P[0]} \ldots M_{P[N-1]}]$ is anti-phased with $[M_{A[0]} \ldots M_{A[N-1]}]$ during the mixing for the following three intents:

Input Impedance Matching and LO-defined RF Filtering: The N-path active/passive mixer generates a frequency-translational loop as illustrated in FIG. 3. Owing to the bidirectional transparency of passive mixers, $M_{P[0]}$ can frequency-translate the lowpass $Z_{in,LPF}\{\Delta\omega\}$ at $V_x$ to bandpass $Z_{in,RF}\{\omega_{LO}+\Delta\omega\}$ at $V_{in}$, enabling LO-defined input matching and RF filtering. Afterwards, the BB signal at $V_x$ is upconverted to $V_{in}$ before being finally down-converted back to $V_x$ by the $-g_{m,CS}$ stage and $M_{A[0]}$. $V_{in}$ contains the fundamental tone at $f_{LO}$ and harmonic components at $|1-gN|f_{LO}$ (with g=±1, ±2 . . . ), and all of them will contribute to the input impedance via the N-path active mixer after downconversion to $V_x$. The equivalent input impedance is given by, $$Z_{in,RF}\{\omega_{LO} + \Delta\omega\} \approx \frac{R_{SW} + \frac{1}{N}\mathrm{sinc}^2\left(\frac{\pi}{N}\right) \cdot Z_{in,LPF}\{\Delta\omega\}}{1 - G_{loop}} \quad (1)$$

Where $G_{loop}$ is the loop gain, $$G_{loop} = \frac{1}{N} \cdot g_{m,CS} \cdot Z_{in,LPF}\{\Delta\omega\} \quad (2)$$

Figure 4A:
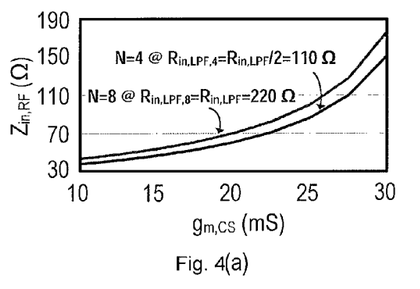
FIGS. 4(a) and 4(b), are graphs illustrating simulated RF input impedance $Z_{in,RF}$ versus: (a) $g_{m,CS}$ under N=4 and 8; (b) $R_{in,LPF}$ under N=4 and 8. The selected $Z_{in,RF}$=70Ω, $g_{m,CS}$=20 mS, $R_{in,LPF}$=220Ω and N=8.
Figure 4B:
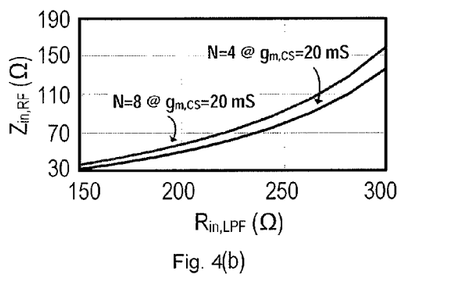
Figure 5:
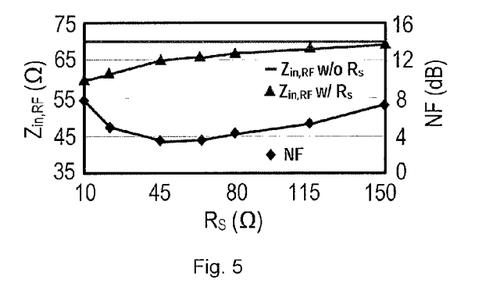
FIG. 5 is a graph illustrating simulated RF input impedance $Z_{in,RF}$ and NF versus $R_S$ variations.

$g_{m,CS}$ is the transconductance of $M_{CS}$, and the last summation term is the frequency-translational factor of the N-path mixing. The resistive part of $Z_{in,LPF}$, denoted as $R_{in,LPF}$, is directly given by the transconductance of the LPF's transistor (i.e., $1/g_{m,LPF}$). N=4 or N=8 generates a similar $Z_{in,RF}$ value and it goes up with $g_{m,CS}$ and $R_{in,LPF}$ as shown in FIGS. 4(*a*) and (*b*), respectively. To cover the TV band, the selected $Z_{in,RF}$ is 70Ω to take into account the $S_{11}$ bandwidth and input capacitance. The NF and $Z_{in,RF}$ of the receiver with $R_s$ and without $R_s$ are plotted in FIG. 5. It shows that $Z_{in,RF}$ is within 63 to 67Ω even when $R_s$ (i.e., the antenna impedance) changes from 35 to 80Ω.

Figure 6A:
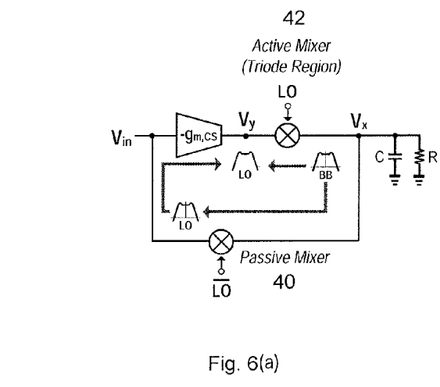
FIG. 6(a) is a circuit diagram illustrating lowpass to bandpass response translation from $V_x$ to $V_{in}$ via the passive mixer, and from $V_x$ to $V_y$ via the active mixer.
Figure 6B:
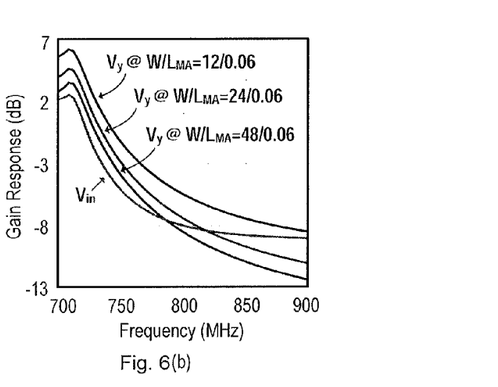
FIG. 6(b) is a graph illustrating simulated responses at $V_{in}$ and $V_y$ with respect to the device size of the active mixer. $V_y$ has stronger out-of-band rejection than $V_{in}$ due to the extra filtering provided by the active mixer.

Given a fixed bias current, N=4 and N=8 show the same $G_{loop}$ ($=g_{m,CS}R_{in,LPF}/N$) at DC, as $R_{in,LPF}$ goes up proportionally when N increases. In this work (N=8), $g_{m,CS}$ is set at 20 mS suitable for noise cancelling (analyzed later) and $G_{loop}$ should be below 1 from Eq. (2), and thus the corresponding $R_{in,LPF}$ should be below 400Ω. The designed value of $R_{in,LPF}$ is e.g. 220Ω for input impedance matching, with the resultant $G_{loop}$ is 0.55, which is well below 1 for stability. Such a $G_{loop}$ results in a 2.2× increment of $Z_{in,RF}$, permitting a smaller $R_{SW}$ (6Ω) to enhance the ultimate stopband rejection at $V_{in}$, which is theoretically 13.3 dB $[2R_{sw}/(R_{sw}+R_S)]$ for $R_S$=50Ω due to the frequency-translational property of the passive mixer. Moreover, to enlarge the voltage headroom and enhance the linearity, the active mixer was biased in the triode region. This act brings down the swing at $V_y$ (drain node of $M_{CS}$) and frequency-translates the lowpass response at $V_x$ to bandpass response at $V_y$, as shown in FIG. 6(*a*). With this extra filtering, $V_y$ shows larger out-of-band rejection than $V_{in}$ (see FIG. 6(*b*)), e.g., $V_y$ has 2.5 dB higher rejection than $V_{in}$ at 200 MHz offset for $W/L_{MA}$=12/0.06. Those responses at $V_y$ also imply that the in-band gain and stopband rejection are in tradeoff under different sizes of the active mixer ($W/L_{MA}$), which correspond to different equivalent ON-resistances. Further, a large $W/L_{MA}$ also implies more LO power. Nevertheless, due to the presence of the passive mixer 40, bandpass filtering happens at the forefront $V_{in}$, inducing a similar response at $V_y$, that is the RF node which can limit the out-of-band linearity. With the filtering at $V_{in}$ and $V_y$, the active mixer 42 can be downsized (W/L: 12/0.06) for saving the LO power, while still generating >10 dB and >13 dB rejection at $V_{in}$ and $V_y$ at 150-MHz offset, respectively. Moreover, the filtering profile of $Z_{in,LPF}$ can be peaked around the cutoff, which is a better bandpass shape after frequency-translation to $V_{in}$ [13] (Darvishi, et al., "Widely tunable $4^{th}$ order switched Gm-C band-pass filter based on N-path filters," *IEEE J. Solid-State Circuits*, vol. 47, no. 12, pp. 3105-3119, December 2012), [14] (Darvishi et al., "Design of active N-path filters," IEEE J. Solid-State Circuits, vol. 48, no. 12, pp. 2962-2976, December 2013). In fact, both the RF and BB bandwidth can be concurrently tuned due to the frequency-translational effect of the mixer, which will be detailed in Section II-B.

Input Biasing: Without any external components and AC-coupling networks, the gate of $M_{CS}$ can be handily biased via the passive mixers copying the DC voltage from $V_x$ to $V_{in}$, also giving adequate overdrive voltage ($V_{DS}$=420 mV) on $M_{CS}$ for better linearity. Furthermore, owing to no AC-coupling capacitor, the RF bandwidth can easily cover the low-frequency range (150 MHz), better than other CG-CS receiver front-ends that entail both a bulky external inductor (40 nH in [10] and 80 nH in [12]) and AC-coupling.

Figure 7A:
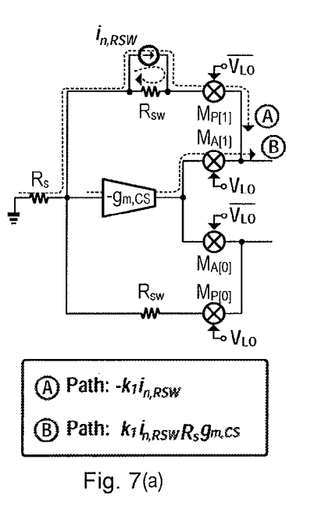
FIGS. 7(a) and 7(b), illustrates simplified two-phase noise equivalent circuits of the RF front-end.

Noise Cancelling: Noise cancellation of $R_{sw}$ and LPF can be concurrently achieved under the parallel N-path active/passive mixers. The passive mixer serves as a current-sensing path, while the active mixer serves as a voltage-sensing path to add the signals constructively and cancel the noise of $R_{sw}$ and LPF under $g_{m,CS} \cdot R_S = 1$. As shown in FIG. 7(*a*), both the noise contribution of $R_{sw}$ and LPF are modeled as noise current sources. For the former, $R_{sw}$ induces a noise current to $R_S$ ($-k_1 \cdot i_{n,R_{sw}}$), and is sensed by the $-g_{m,CS}$ stage to produce an anti-phased output noise current ($k_1 \cdot g_{m,CS} \cdot R_S \cdot i_{n,R_{sw}}$), which nullifies the noise inherently. The output noise due to the $R_{sw}$ can be derived as:

$$\overline{i^2_{n,R_{SW},out}} = \left| \frac{(1-g_{m,CS} \cdot R_S)R_{SW}}{(R_S+R_{SW})N+(1-g_{m,CS} \cdot R_S)Z_{in,LPF}\{\Delta\omega\}} \right|^2 \cdot \overline{i^2_{n,R_{SW}}} \quad (3)$$

Figure 7B:
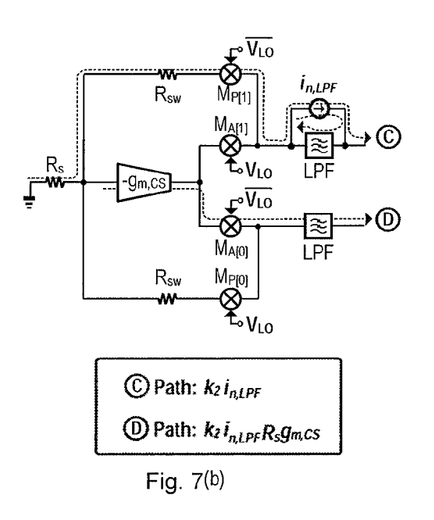

For the LPF, when the receiver is operated differentially, the noise of LPF (FIG. 7(*b*)) generates a noise current on $R_S$ ($k_2 \cdot i_{n,LPF}$), which is copied to another path with the same phase ($k_2 \cdot g_{m,CS} \cdot R_S \cdot i_{n,LPF}$), being a cancellable common-mode noise. Thus, the differential output noise due to the LPF is simplified as, $$\overline{i^2_{n,LPF,out}} = \left| \frac{(1+c_1)(1-g_{m,CS} \cdot R_S)}{1+c_2} \right|^2 \cdot \overline{i^2_{n,LPF}} \quad (4)$$

where $c_1$ and $c_2$ are constants as given by, $$c_1 = \frac{g_{m,CS} \cdot R_S}{1+g_{m,LPF}(R_S+R_{SW})N} \quad (5)$$

$$c_2 = g_{m,LPF}(R_S+R_{SW})N - \frac{(g_{m,CS} \cdot R_S)^2}{1+g_{m,LPF}(R_S+R_{SW})N} \quad (6)$$

The above expressions show that the noise of both passive mixer and LPF can be made insignificant when the condition $g_{m,CS} \cdot R_S = 1$ is met. Again, due to the high drain-source output impedance of $M_{CS}$, the active mixer contribution is insignificant to the in-band noise. Considering the major noise sources from $M_{CS}$ ($v_{n,CS}$) and load ($v_{n,L}$), the receiver noise factor (F) can be derived as below, $$F = \left(1 + \frac{\overline{v^2_{n,CS}}}{\overline{v^2_{n,R_S}}} + 2N \cdot \frac{R^2_S}{R^2_L} \cdot \frac{\overline{v^2_{n,L}}}{\overline{v^2_{n,R_S}}}\right) \frac{1}{\text{sinc}^2(\pi/N)} \quad (7)$$

A large $R_L$ reduces its noise contribution, rendering the in-band NF dominated by the thermal noise of $M_{CS}$ (i.e., $F \approx 1+\gamma$, where $\gamma$ is the channel noise factor). Thus, although this receiver front-end consumes low power, it shows a theoretical NF limit of ~3 dB, which is higher than the dual-path receiver in [9], but it is comparable to other high-linearity passive-mixer-first receivers such as [2]. To reduce also the 1/f noise, $M_{CS}$ is upsized (W/L: 120/0.18). A large N is more beneficial to the NF due to the frequency-translational factor $\text{sinc}^2(\pi/N)$ of the mixer. For example, the NF for N=4 shows around 0.68 dB degradation when compared with that under N=8 under the same current condition with the same $M_{CS}$, because $R_L$ for N=8 is two times as that for N=4, thus the load of the two cases contribute the same noise as seen from Eq. (7). In this design (N=8), for a 1.6-mA bias current (i.e., corresponding to $g_{m,CS}$ of 20 mS), the simulated NF of the receiver front-end is 3.6 dB, of which ~0.5 dB is contributed by $M_L$ and $R_L$. As revealed in [9] and [15] (F. Bruccoleri, E. Klumperink, and B. Nauta, "Wide-band CMOS low-noise amplifier exploiting thermal noise canceling," IEEE J. Solid-State Circuits, vol. 39, no. 2, pp. 275-282, February 2004) the noise cancelling mechanism is relatively robust to mismatches. From simulations, the NF varies only 0.15 dB with 20% current offset. When the input parasitic capacitance (1.5 pF) is accounted, the NF is degraded by ~0.4 dB in the covered frequency range. From FIG. 5, the NF is ~4 dB when $R_s$ is changed from 35 to 80Ω. Beyond that, the NF increases further due to both impedance mismatch and imperfect noise cancellation.

B. Current-Mode Single-MOS Pole-Zero LPF

Traditional LPFs using operational amplifiers are unsuitable for current reuse with other circuitry. Current-mode LPFs, such as the pipe filter [16] (A. Pirola et al., "Current-mode, WCDMA channel filter with in-band noise shaping," IEEE J. Solid-State Circuits, vol. 45, pp. 1770-1780, September 2010) are more transistorized and suitable for stacking with the active mixer for current-reuse and current-mode filtering [12] that has in-band noise shaping and high linearity. However, a $2^{nd}$-order current-mode Biquad [16] involves two transistors in cascode, pressuring the voltage headroom. More importantly, its input impedance features an in-band zero at DC, which is inappropriate for frequency translation to RF that otherwise nullifies the in-band gain. The single-MOS current-mode Biquad in [17] (J. Greenberg et al., "A 40 MHz-to-1 GHz fully integrated multistandard silicon tuner in 80-nm CMOS," IEEE J. Solid-State Circuits, vol. 48, pp. 2746-2761, November 2013) alleviates the problems of voltage headroom and zero at DC, but still, only two poles are synthesized. To enhance the close-in stopband rejection, the present invention provides a current-mode single-MOS pole-zero LPF as detailed below.

Figure 8A:
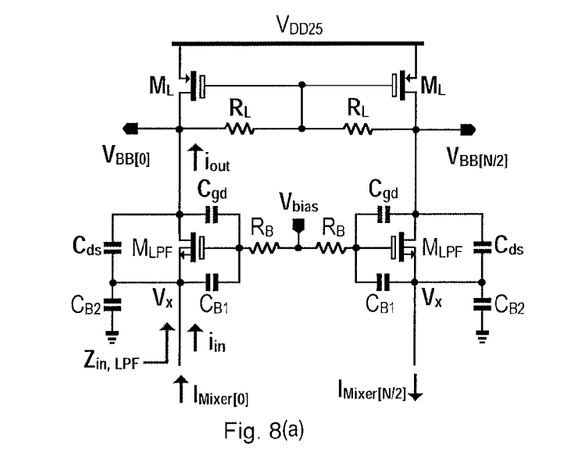
Figure 8B:
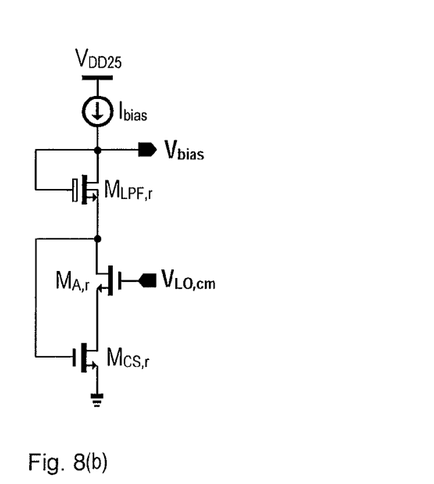
FIG. 8(b) shows its replica bias circuit.

The differential schematic of the single-MOS pole-zero LPF and its replica bias circuit are shown in FIGS. 8(*a*) and (*b*), respectively. For the LPF, $M_{LPF}$ (with $g_{m,LPF}$) is the only active device, working with $C_{B1,2}$ and $R_B$ to create the complex poles [17], and plus $C_{gd}$ and $C_{ds}$ to create the stopband zeros. The BB I-to-V conversion and common-mode feedback are associated with the self-biased $M_L$ such that a big $R_L$ can be applied, alleviating the tradeoff between voltage headroom and BB gain. As $M_L$ is diode-connected, it can be considered as a current mirror to copy the signals to the next HR stage (Section II-C). $M_L$ and $M_{LPF}$ are thick-oxide MOS to withstand the high $V_{DD}$ (2.5 V) that enlarges the device overdrives and $P_{-1dB}$. Working at BB, bigger $M_L$ and $M_{LPF}$ are allowed to reduce the 1/f noise. Moreover, $R_L$ can be tuned for gain control without affecting the output DC bias point. The grounded $C_{B2}$ is added for LO feedthrough mitigation and better out-of-band attenuation of interferences.

For the bias circuit, $M_{CS,r}$, $M_{A,r}$ and $M_{LPF,r}$ are the replicas of $M_{CS}$, $M_A$ and $M_{LPF}$, respectively. The gate bias of $M_{CS,r}$ is handily copied from the drain of $M_{A,r}$. $V_{LO,cm}$ copies the common-mode voltage of the LO. After simplification, the I/O transfer function and input impedance [$Z_{in,LPF}(s)$] of the LPF can be derived, $$\frac{i_{out}(s)}{i_{in}(s)} \approx \frac{s^2 \frac{C_{gd}+C_{ds}}{C_{B2}} + \frac{g_{m,LPF}}{C_{B1}C_{B2}R_B}}{s^3[(C_{gd}+C_{ds})R_L] + s^2\left[1 + \frac{C_{gd}g_{m,LPF}R_L}{C_{B1}} + \frac{(C_{B1}+C_{B2})(C_{gd}+C_{ds})R_L}{C_{B1}C_{B2}R_B}\right] + s\frac{(C_{B1}+C_{B2})}{C_{B1}C_{B2}R_B} + \frac{g_{m,LPF}}{C_{B1}C_{B2}R_B}} \quad (8)$$

$$Z_{in,LPF}(s) \approx \frac{s^2\left[\frac{(C_{gd}+C_{ds})R_L}{C_{B2}}\right] + s\left[\frac{1}{C_{B2}} + \frac{C_{ds}(1+g_{m,LPF}R_L)}{C_{B1}C_{B2}} + \frac{(C_{gd}+C_{ds})R_L}{C_{B1}C_{B2}R_B}\right] + \frac{1}{C_{B1}C_{B2}R_B}}{s^3[(C_{gd}+C_{ds})R_L] + s^2\left[1 + \frac{C_{gd}g_{m,LPF}R_L}{C_{B1}} + \frac{(C_{B1}+C_{B2})(C_{gd}+C_{ds})R_L}{C_{B1}C_{B2}R_B}\right] + s\frac{(C_{B1}+C_{B2})}{C_{B1}C_{B2}R_B} + \frac{g_{m,LPF}}{C_{B1}C_{B2}R_B}} \quad (9)$$

where the two pairs of dominant poles and zeros are located at, $$f_p = \frac{1}{2\pi}\sqrt{\frac{g_{m,LPF}}{C_{B1}C_{B2}R_B + C_{B2}C_{gd}g_{m,LPF}R_LR_B + (C_{B1}+C_{B2})(C_{gd}+C_{ds})R_L}} \quad (10)$$

$$f_z = \frac{1}{2\pi}\sqrt{\frac{g_{m,LPF}}{C_{B1}(C_{gd}+C_{ds})R_B}} \quad (11)$$

When sizing the LPF, an intentionally large transistor $M_{LPF}$ (W/L: 768/0.5) with bulk-source connection is used, which has equivalent parasitic $C_{gd}$ and $C_{ds}$ of ~0.6 pF, creating the two stopband zeros. Differing from the current-mode Biquads in [16], [17] that only can synthesize two complex poles, this design offers faster-roll-off pole-zero filtering, being more cost-effective than its real-pole-only counterparts

Figure 9A:
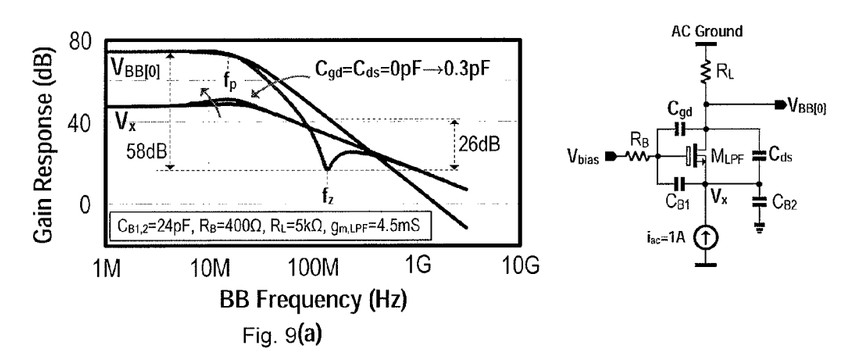
FIG. 9(a) illustrates simulated (a) $V_{BB[0]}$ and $V_x$ showing the rejection added by the stopband zeros.

[1]-[4]. FIG. 9(a) shows the simulated filtering profile with $C_{B1,2}$=24 pF, $R_B$=400Ω, $R_L$=5 kΩ and $g_{m,LPF}$=4.5 mS. Without $C_{gd}$ and $C_{ds}$, the stopband profile is 40 dB/dec. When $C_{gd}$ and $C_{ds}$ are presented and increased to 0.3 pF, the stopband zeros effectively boost the stopband rejection. In this design, the zeros are placed at 150-MHz offset, so as to filter out: 1) the LO-to-IF leakage for the targeted RF bandwidth due to 150 MHz (the employed 8-path active mixer can be considered as an extension of 2-path single-balanced active mixer), and 2) the GSM850/900 bands when the receiver is operated up to 710 MHz for IEEE 802.11af. From simulations, a 26-dB improvement (58 dB rejection in total) is achieved when comparing it with pure-pole Biquad at 150-MHz offset. In Monte Carlo simulations, the −3-dB $BW_{mean}$ is 14.6 MHz (σ=0.48 MHz) and the stopband zero is located at 154 MHz (σ=6.3 MHz) with average rejection of 54.7 dB (σ=1.08 dB). The RF-to-BB gain at $V_{BB[0]}$ can be expressed as $2/N \cdot \text{sinc}(\pi/N) \cdot g_{m,CS} \cdot R_L$, which is 26 dB in the design with $R_L$=5 kΩ. For the receiver front-end, the simulated in-band $P_{-1dB}$ and IIP3 at $V_{BB[0]}$ are −17 and 0 dBm at a 2.5-V supply, respectively. Given a bias current, the gain and NF are almost constant if the supply is reduced to 1.8 V, but the in-band $P_{-1dB}$ and IIP3 will be penalized to −26 and −11 dBm, respectively.

Figure 9B:
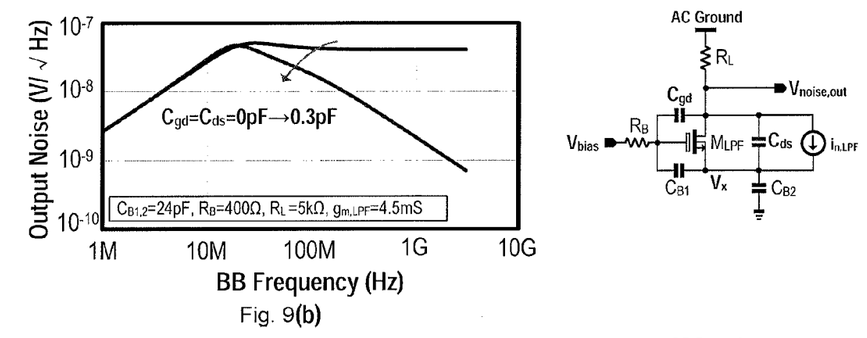
FIG. 9(b) illustrates output noise with and without stopband zeros.

The current-mode LPF features in-band noise shaping when it is operated with the active mixer. Its noise contribution can be modeled as a current source connected between drain and source of $M_{LPF}$. To evaluate it, a derivation is done with the result given in Eq. (12) after simplification. By resorting from $C_{gd}$ and $C_{ds}$ to create the stopband zeros, the noise distribution also differs from the typical Biquad. From simulations (FIG. 9(b)), the output noise has a bandpass shape under the condition of $C_{gd}$=$C_{ds}$=0.3 pF, other than a highpass shape without $C_{gd}$ and $C_{ds}$, because they shunt the noise current at high frequency. Their in-band noise responses are the same.

$$\overline{i^2_{noise,LPF}}(s) \approx \frac{(s^2 C_{B1}C_{B2}R_B + sC_{B1} + sC_{B2}) \cdot \overline{i^2_{n,LPF}}}{s^3[(C_{gd}+C_{ds})C_{B1}C_{B2}R_BR_L] + s^2[C_{B1}C_{B2}R_B + (C_{gd}+C_{ds})(C_{B1}+C_{B2})R_L + C_{B2}C_{ds}g_{m,LPF}R_BR_L] + s(C_{B1}+C_{B2}+C_{ds}g_{m,LPF}R_L) + g_{m,LPF}} \quad (12)$$

Referring back to FIG. 9(a), the LPF features a peak response around the cutoff for its input impedance (see Eq. (9)) due to $C_{gd}$ and $C_{ds}$; they enhance not only the filtering profile, but also avoid the fast roll-off shape when it is translated to RF.

Figure 9C:
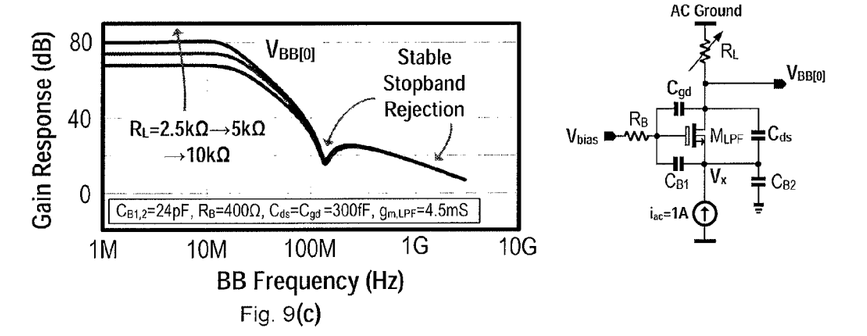
FIG. 9(c) illustrates sizing $R_L$ for in-band gain and linearity tradeoff.

Another notable property of this LPF relates to its stopband profile and $R_L$ as showed in FIG. 9(c). As the current-mode filtering effects at input and output nodes of the LPF, mainly the passband gain is altered by $R_L$, easing the tradeoff between the in-/out-of-band linearity. For instance, a large $R_L$ can enhance the stopband rejection at the expense of in-band IIP3 and $P_{-1dB}$, and is bounded by the $Z_{in,LPF}$ variations.

Figure 10:
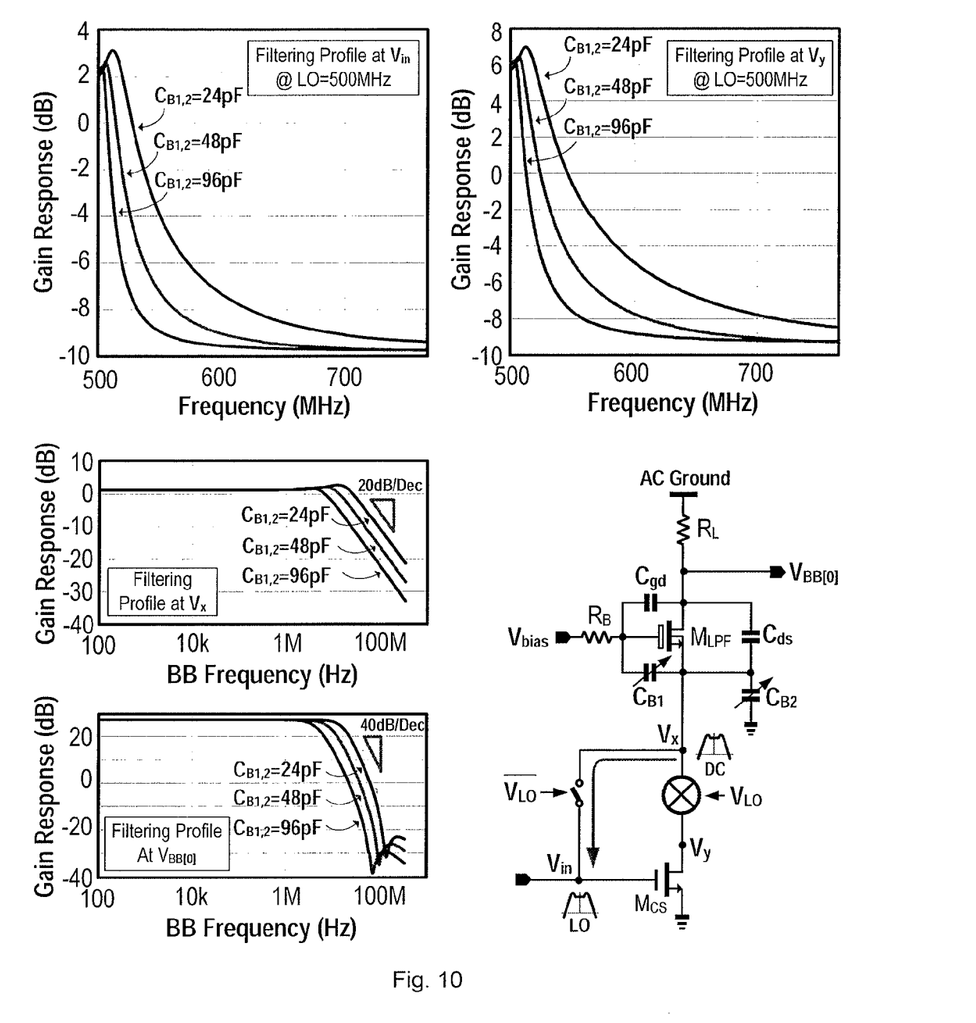
FIG. 10 illustrates simulated frequency-translated RF bandwidth at $V_{in}$ and $V_y$; BB bandwidth at $V_x$ and $V_{BB[0]}$ are concurrently controlled by $C_{B1,2}$.

Due to the frequency-translation property of the N-path mixer, the BB LPF can define concurrently the RF and BB bandwidth. Thus, without affecting most in-band metrics and power, adjusting $C_B$ can effectively suppress the out-of-band interferers before they reach the active devices at both RF and BB. From simulations, when $C_{B1,2}$ is increased from 24 to 96 pF (the tradeoff with the die area), a higher Q bandpass response can be created at $V_{in}$ and $V_y$, as shown in FIG. 10. The zero of $Z_{in,LPF}$ is chosen at ~10 MHz, where the 1-dB gain peak leads to ~1.5 dB variations of in-band IIP3 (simulation). The Q factor can be lowered by reducing $g_{m,LPF}$ and $R_B$. The ultimate rejection is limited by the size of $R_{sw}$. The BB responses at $V_x$ and $V_{BB[0]}$ are 20 dB/dec and >40 dB/dec, respectively, as expected from Eqs. (8) and (9).

C. BB-only Two-Stage Harmonic-Recombination (HR) Amplifier

Figure 11A:
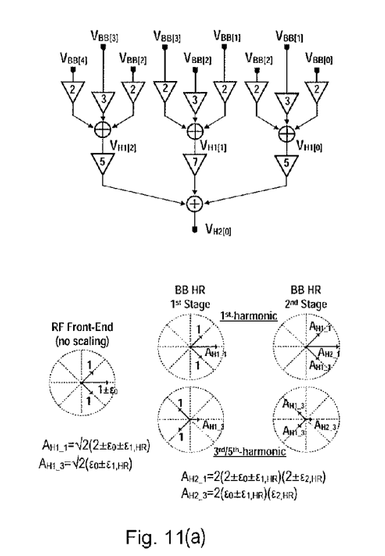
FIG. 11(a) is a block diagram of the 2-stage BB-only HR and its vector diagram.

Single-stage HR measured an uncalibrated $HRR_{3,5}$ of 34 to 45 dB [4], [9]. The BB-only two-stage HR amplifier of the present invention boosts the $HRR_{3,5}$ without any gain scaling at RF [1], resulting in simpler layout and lower parasitics. FIG. 11(a) shows the principle of the two-stage HR to recombine the 8-phase BB outputs $[V_{BB[0]} \ldots V_{BB[7]}]$ from the front-end, and generate the final differential BB I/Q outputs $[\pm V_{O,I}, \pm V_{O,Q}]$. Three 45°-apart signals of $\{V_{BB[0]}:V_{BB[1]}:V_{BB[2]}\}$, $\{V_{BB[1]}:V_{BB[2]}:V_{BB[3]}\}$, and $\{V_{BB[2]}:V_{BB[3]}:V_{BB[4]}\}$, with weighting ratio of $\{2:3:2\}$, are arranged to generate three new 45°-apart signals of $\{V_{H1[0]}:V_{H1[1]}:V_{H1[2]}\}$, which are then weighted again by $\{5:7:5\}$ to reproduce the desired gain ratio $\{1:\sqrt{2}:1\}$ for harmonic cancellation. This two-step HR method can approximate the gain ratio $\{1:\sqrt{2}:1\}$ with <0.1% error [1]. From the illustrated vector diagram, by pushing back the two-stage HR to BB, the multiplication of errors to improve HRR still holds. The total relative gain error is made insignificant due to the multiplication of error: $(\epsilon_o + \epsilon_{1,HR})\epsilon_{2,HR}/4$, where $\epsilon_o$ is the relative gain error of the front-end; $\epsilon_{1,HR}$ and $\epsilon_{2,HR}$ are the relative gain errors of the BB $1^{st}$ and $2^{nd}$ HR stages, respectively. The error $\epsilon_o$ is merged into the $1^{st}$ stage and theoretically the $2^{nd}$ stage with 1% error can improve the harmonic rejection by 46 dB under an ideal 8-phase LO.

Figure 11B:
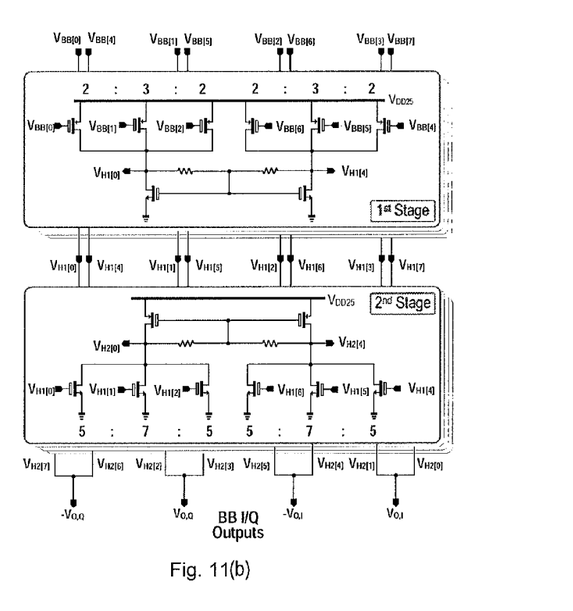
FIG. 11(b) shows its circuit implementation as a 2-stage HR amplifier.

In the implementation (see FIG. 11(b)), identical amplifiers with differential configuration in both $1^{st}$ and $2^{nd}$ stages are employed to ensure that each signal has the same load condition, mitigating the parasitic effects. The gain weighting is based on a PMOS-input amplifier $\{2:3:2\}$ followed by a NMOS-input amplifier $\{5:7:5\}$ with self-biased loads. By extending the two-stage HR to BB, the circuit complexity is reduced and the irrational gain ratio $\{1:\sqrt{2}:1\}$ is realized accurately due to the realized rational numbers.

Owing to the embedded BB channel selectivity at the front-end, the linearity of such a HR amplifier is highly relaxed, so as its power budget. The latter also leads to limited BB bandwidth assisting the stopband rejection. From Monte Carlo simulations, the in-band $HRR_{3,5} \geq 62$ dB (mean) and 53 dB (worst) under an ideal 8-phase LO. Thus, the $HRR_{3,5}$ should be limited mainly by the LO phase error similar to [1].

D. 8-Phase 12.5%-Duty-Cycle LO Generator

Figure 12A:
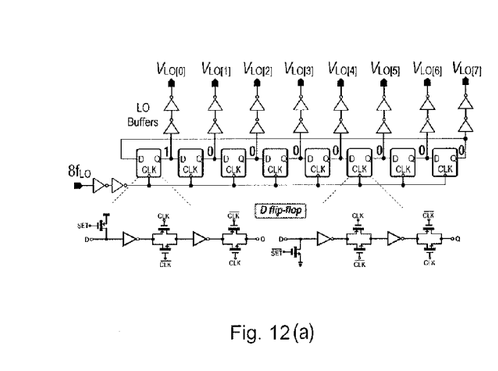
FIG. 12(a) illustrates an 8-phase LO generator and FIG. 12(b) is a graph showing its simulated phase error and power versus LO frequency.
Figure 12B:
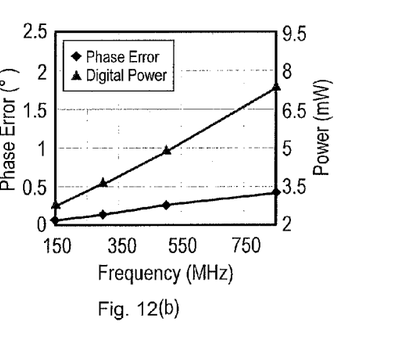

To lower the LO phase error and jitter at pulse edge, a dynamic div-by-8 circuit (see FIG. 12(a)) based on transmission-gate flip-flop cell as in [1] is employed to generate a 12.5% 8-phase LO without needing AND gates. For saving the LO power, the 8-phase LO is buffered to drive the mixer with rise and fall time of ~25 ps (2% LO period at 850 MHz), of which the effect on the gain and NF is insignificant for such a sub-GHz operation. In the covered band from 0.15 to 0.85 GHz, the simulated phase error goes up from $\sigma=0.045°$ to 0.4°, at the power of 2.8 to 7.5 mW (see FIG. 12(b)). If a high HRR is desired, the accuracy of the phase error can be enhanced with more dynamic power being provided to the high-frequency LO buffer and dividers, as analyzed in [1].

Simulated at 0.55 GHz, the output phase noise of the LO generator is −155 dBc/Hz at $\Delta f=0.15$ GHz, where $\Delta f$ is the frequency offset from the LO. As $V_{in}$ has ~10-dB rejection at $\Delta f=0.15$ GHz, the 0-dBm blocker NF is at least 9 dB (i.e., 174 dBm−155 dBc−10 dB) due to the reciprocal mixing effect. To address this, the LO generator proposed in [9] can be employed, which has a power efficiency of 13.3 mA/GHz in 40 nm CMOS.

III. Experimental Results

Figure 13:
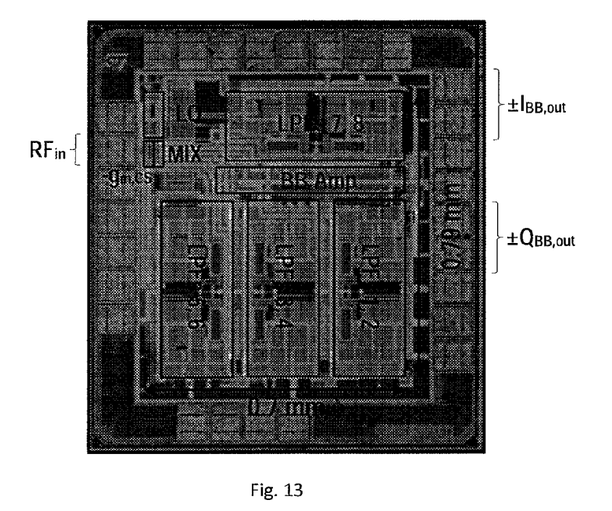
FIG. 13 is a chip micrograph of the fabricated receiver in 65-nm CMOS.

The receiver according to one example embodiment was fabricated in a 1.2/2.5-V 65-nm CMOS process. A deep n-well was employed for the bulk-source connection in the single-MOS LPF. The chip micrograph is shown in FIG. 13. Without any on-chip inductors or external components, the die area is small (0.55 mm$^2$) and it is dominated by the 8-path LPFs with $C_B=24$ pF. All measurements were on one randomly selected die and small die-to-die variations were observed.

A. Input Matching, NF, Gain and Power Consumption

Figure 14A:
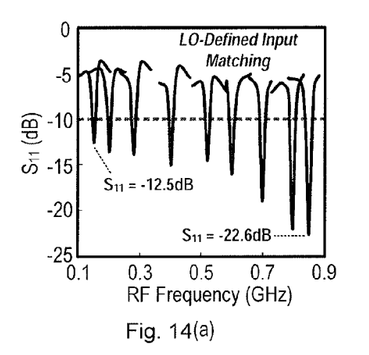
FIG. 14(a) shows the measured LO-defined narrowband S$_{11}$.
Figure 14B:
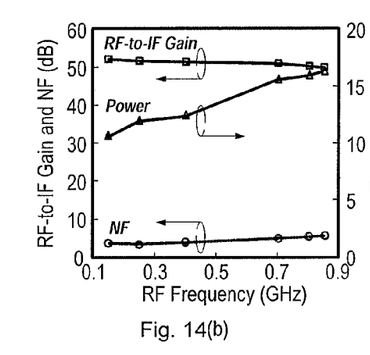
FIG. 14(b) shows RF-to-IF gain, power, and NF versus RF frequency.

The receiver covers 0.15 to 0.85 GHz (VHF-H and UHF bands) with a LO-defined narrowband input matching $S_{11}<-12.5$ dB [FIG. 14(a)]. It serves as an indirect measurement of the bandpass filtering effect translated to $V_{in}$. Both RF-to-IF gain (51±1 dB) and NF (4.6±0.9 dB) are wideband stable and the results include the PCB losses (see FIG. 14(b)). The NF increases with frequency due to the limited drivability of the LO buffers and phase noise of the LO generator. The latter couples to the RF port through the mixer parasitic capacitances and raises the NF up to ~1 dB at 850-MHz RF. The estimated pad capacitance at the RF input is ~1.5 pF, which affects the NF at high frequency but improves the $S_{11}$. The power increases with the RF frequency from 10.6 to 16.2 mW due to the dynamic power of the LO generator. The static power (RF+BB) is only 7.5 mW comprising the current-reuse front-end (1.6 mA at 2.5 V) and the two-step BB HR amplifier (1.4 mA at 2.5 V).

B. Linearity

Figure 15A:
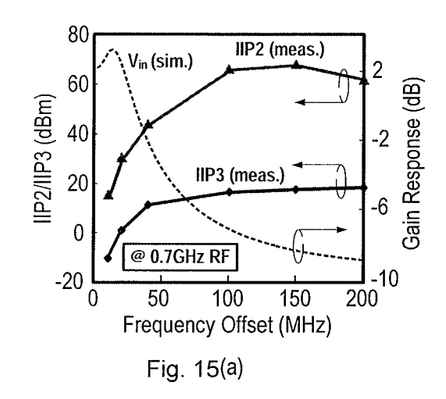
FIG. 15(a) shows measured in-band to out-of-band IIP2/IIP3, obeying the filtering profile provided at V$_{in}$.
Figure 15B:
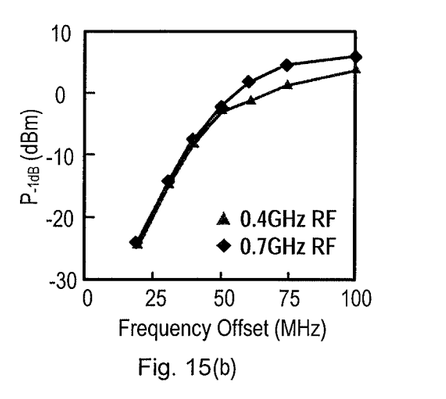
FIG. 15(b) shows P$_{-1dB}$ versus frequency offset from in-band to out-of-band.

Both the Blixer [10] and this work involve only one RF V-to-I conversion, but the Blixer uses wideband input matching and RF gain, while this work features bandpass filtering at $V_{in}$, thus significantly improving the out-of-band linearity. Two-tone tests with frequency at $[f_{LO}+\Delta f, f_{LO}+\Delta f+1$ MHz$]$ and $[f_{LO}+\Delta f, f_{LO}+2\Delta f-1$ MHz$]$ were applied to measure IIP2 and IIP3, respectively. At 0.7-GHz RF and maximum gain, the in-band IIP2/IIP3 is +15/−12 dBm with an input power of around −50 dBm, whereas the out-of-band IIP2/IIP3 is +61/+17.4 dBm with an input power of around −25 dBm (see FIG. 15(a)). As shown in FIG. 15(b), the measured $P_{-1dB}$ at 20 MHz is −25 dBm and the ultimate out-of-band $P_{-1dB}$ is >+2.5 dBm, which are consistent with the IIP3 measurements. Another critical scenario is that two-tones at $[f_{LO}-\Delta f, \Delta f+1$ MHz$]$ or $[f_{LO}+\Delta f, \Delta f-1$ MHz$]$ would also generate second-order distortion. The measurement at 0.7 GHz with $\Delta f=150$ MHz shows that the IIP2 with two tones at 0.151 and 0.55 GHz is +22 dBm, and with 0.149 and 0.85 GHz is +21 dBm. Both are limited by $M_{CS}$ at RF.

C. BB Response and HRR

Figure 16A:
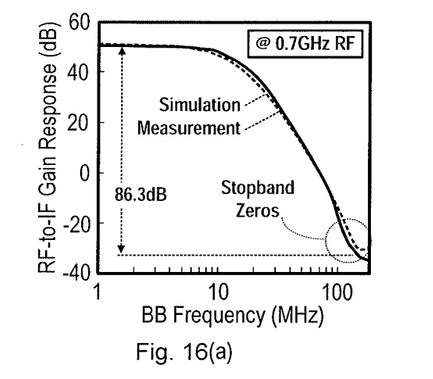
FIG. 16(a) is a graph illustrating measured RF-to-IF gain response, showing the enhanced rejection profile due to the stopband zeros.

The BB bandwidth is close to 9 MHz, with strong stopband rejection of 86.3 dB at 150-MHz offset, due to the dual poles and dual stopband zeros associated with the LPF (see FIG. 16(a)).

Figure 16B:
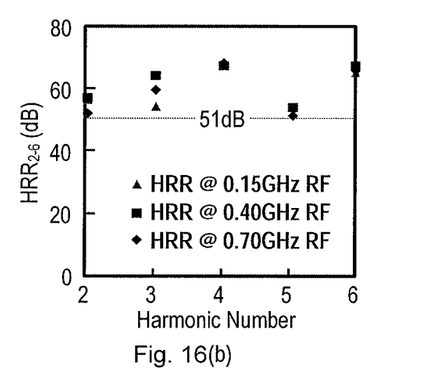
FIG. 16(b) illustrates HRR$_{2-6}$ without calibration or tuning.

The measured $HRR_{2-6}$ from 3 chips are >51 dB without any calibration or trimming (see FIG. 16(b)), confirming its improvement over the conventional one-stage BB HR that is normally <45 dB. To prevent 1-dB gain compression at the BB output, the maximum RF input power at the $3^{rd}$ LO harmonic is −18 dBm.

Figure 17A:
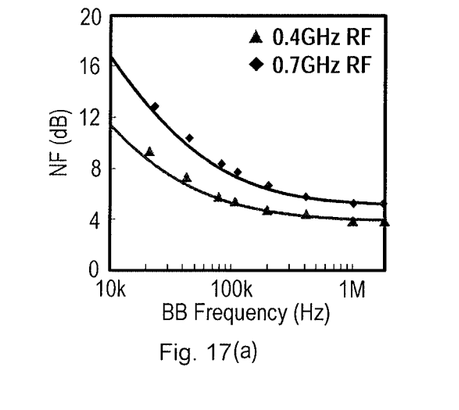
FIG. 17(a) shows measured BB NF.

Although a single-ended RF input can eliminate the external wideband balun and its associated losses, the noise from the LO divider and buffer at fundamental frequency will couple to the RF via the 8-path passive mixer, thus degrading the NF after being down-converted to BB by the mixer as discussed in [9]. This effect is reflected in the measurement of 1/f noise versus the intermediate frequency (see FIG. 17(a)). Due to the uncorrelated phase noise of the LO, both 1/f noise and thermal noise go up with the RF/LO frequency. The degradation of 1/f noise may come from LO self-mixing, and incomplete 1/f noise cancellation of the BB LPF transistors at high frequency. The 1/f noise corners are around 100 to 200 kHz comparable to the passive-mixer-first design [2].

D. Blocker Tolerability

Figure 17B:
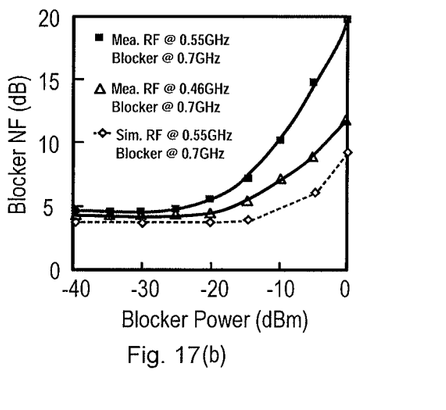
FIG. 17(b) shows Blocker NF.

The blocker tolerability of the receiver is measured as follows: the CW blocker is given by a signal generator (e.g., Agilent E8267D) that has a phase noise of −147 dBc/Hz at $\Delta f=0.15$ GHz, which is much higher than the kT noise (−174 dBm/Hz). Thus, a 0.7-GHz highpass filter (Mini-Circuits SHP-700+) should be added at the RF port to suppress such a phase noise [9, FIG. 2] [18] (J. Park and B. Razavi, "A 20 mW GSM/WCDMA receiver with RF channel selection," ISSCC Dig. Tech. Papers, pp. 356-357, February 2014). For the reference LO, it is given by another signal generator (e.g., Agilent E4438C) that has a phase noise of −152 dBc/Hz. After div-by-8, the phase noise is close to −170 dBc/Hz at $\Delta f=0.15$ GHz, implying that off-chip filtering is unnecessary for the reference LO, as the phase noise is dominated by the on-chip LO generator here (see Section II-D). Measured at 0.55 GHz ($\Delta f=0.15$ GHz) and 0.46 GHz RF ($\Delta f=0.24$ GHz), the blocker NF against the power of the CW blocker at 0.7 GHz are plotted in FIG. 17(b). With the 0.7-GHz highpass filter offering 18 (35) dB rejection at 0.55 (0.46) GHz, the 0 dBm-blocker NF is around 20 (12) dB. The 18 dB rejection at 0.55 GHz is inadequate to suppress the phase noise from the signal generator to achieve <−174 dBm/Hz, rendering a higher blocker NF. Simulations show that a 0 dBm-blocker degrades the NF by only 1 dB under an ideal LO. When the LO phase noise is included, as shown in FIG. 17(b), the simulated blocker NF is <10 dB. In practice, on top of the reciprocal mixing effect, a large blocker can also saturate $M_{CS}$, LO phase error can degrade the out-of-band rejection offered by the passive mixers and affect the effectiveness of noise cancelling. To enhance the rejection at a smaller $\Delta f$, the area budget (size of $C_{B1,2}$) of the receiver should be increased.

E. LO Reradiation

The measured direct LO reradiation at 0.2 (0.7) GHz is −70 (−67) dBm, and −70 (−66) dBm at the $3^{rd}$ harmonic at the absence of RF input. The simulated LO reradiation at the $8^{th}$ harmonic is −47 (−44) dBm at 0.2 (0.7) GHz RF, which is hard to be measured due to the limited PCB isolation between the RF and LO ports.

F. Chip Summary and Comparison

Figure 18:
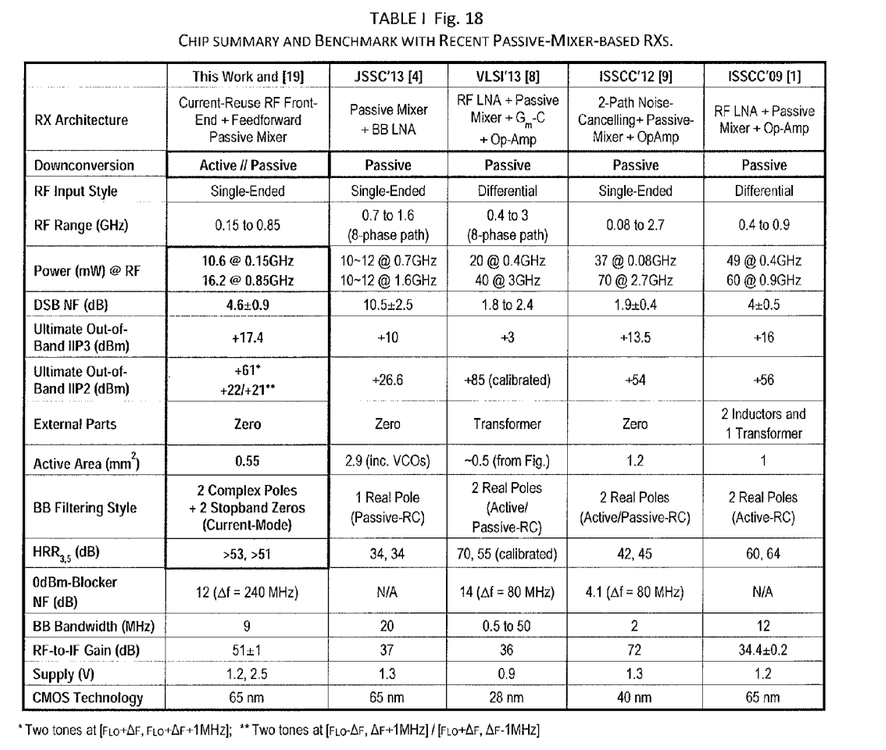
FIG. 18 is a table (Table I) showing chip summary and benchmark with recent passive-mixer-based RXs.
Figure 19:
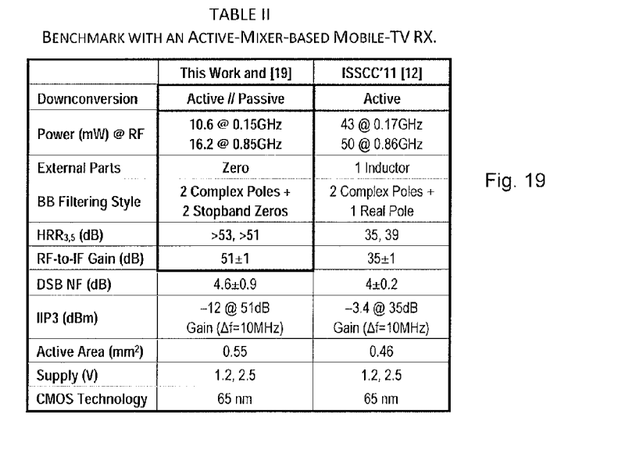
FIG. 19 is a table (Table II) showing benchmark with an active-mixer-based mobile-TV RX.

The chip summary is given in Table I (see FIG. 18). Benchmarking with the state-of-the-art passive-mixer-based receivers [4], [8], [9], [1], this work [19] (F. Lin, P.-I. Mak and R. P. Martins, "An RF-to-BB-Current-Reuse Wideband Receiver with Parallel N-Path Active/Passive Mixers and a Single-MOS Pole-Zero LPF," IEEE ISSCC Dig. Tech. Papers, pp.74-75, February 2014) succeeds in saving the total power consumption without sacrificing the NF, out-of-band linearity, and HRR, but the blocker NF is inferior when compared with [9]. Nevertheless, no external components are entailed and strong BB filtering is achieved in a small die size. Besides, its advantages over the active-mixer-based TV-band receiver [12] are also evident as compared in Table II (see FIG. 19).

IV. Conclusions

By virtue of the features of the present invention, a wideband receiver exploiting parallel N-path active/passive mixers, single-MOS pole-zero LPFs, and BB-only two-stage HR amplifiers has been designed and verified in 65-nm CMOS. It features an N-path active mixer to enable current-reuse and current-domain signal processing in a stacked RF-to-BB front-end. For the RF filtering, input impedance matching, input biasing, and noise cancelling, these are concurrently achieved with the feedforward N-path passive mixer. High-order BB filtering is merged with the front-end by adopting a single-MOS pole-zero LPF. The BB-only two-stage HR amplifier improves the harmonic rejection with low hardware intricacy. Measurement results verified the merits of this work in balancing the NF and linearity with power and area.

It is noted that Applicants previously authored a publication entitled "An RF-to-BB Current-Reuse Wideband Receiver with Parallel N-Path Active/Passive Mixers and a Single-MOS Pole-Zero LPF," 2014 IEEE International Solid-State Circuits Conference, ISSCC 2014/SESSION 3/RF TECHNIQUES/3.9/dated Feb. 10, 2014 (authors Fujian Lin, Pui-ln Mak, Rui Martins), which is hereby incorporated by reference.

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. Thus, the present invention should not be limited by any of the above-described exemplary embodiments, but should be defined only in accordance with the following claims and their equivalents.

In addition, it should be understood that the Figures illustrated in the attachments, which highlight the functionality and advantages of the present invention, are presented for example purposes only. The architecture of the present invention is sufficiently flexible and configurable, such that it may be utilized (and navigated) in ways other than that shown in the accompanying figures.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

We claim:

1. A single-ended-input current-reuse wideband receiver, comprising:
    a stacked RF-to-BB front end adapted to receive an RF signal and having:
    a plurality of parallel N-path active mixers for processing the RF signal by performing amplification, harmonic-recombination down-conversion, and baseband (BB) filtering on the RF signal in a single combined cell to generate an N-phase BB signal;
    a plurality of parallel feedforward N-path passive mixers for performing input impedance matching, frequency-translated bandpass filtering, input biasing, and noise cancelling on the generated N-phase BB signal;
    a single-MOS pole-zero lowpass filter (LPF) to filter the N-phase BB signal and having a lowpass input impedance for high stopband rejection at low voltage headroom consumption; and
    a BB-only two-stage harmonic-recombination (HR) amplifier for performing two-step harmonic recombination of the filtered N-phase BB signal to enhance third and fifth harmonic rejection ratios without any gain scaling, performing BB current-to-voltage conversion and generating final differential BB I/Q outputs.

2. The receiver as set forth in claim 1, wherein N is 8.

3. The receiver as set forth in claim 1, wherein N is 4.

4. The receiver as set forth in claim 1, wherein the receiver has no components external to the single combined cell.

5. The receiver as set forth in claim 1, wherein the receiver is used for TV-band applications.

6. The receiver as set forth in claim 1, wherein the front end further comprises a low-noise amplifier for amplifying and performing voltage-to-current conversion on the received RF signal.

7. The receiver as set forth in claim 6, wherein the low-noise amplifier is a common source amplifier.

8. The receiver as set forth in claim 1, wherein the BB-only two-stage HR amplifier comprises a high-order current-mode low-pass filter providing channel selection before current-to-voltage conversion of the BB signal.

9. The receiver as set forth in claim 2, wherein the BB-only two-stage HR amplifier comprises N N-phase BB outputs for two-step harmonic recombination outside the front end to reject LO harmonics up to N−2, N being an even integer, the LO being generated by a div-by-8 circuit.

10. The receiver as set forth in claim 1, wherein the plurality of parallel feedforward N-path passive mixers generate a frequency-translational loop to perform the input impedance matching and frequency-translated bandpass filtering.

11. The receiver as set forth in claim 10, wherein the frequency-translation loop comprises a MOS $M_{P[0]}$ which frequency-translates a lowpass impedance $Z_{in,LPF}\{\Delta\omega\}$ at $V_x$ to a bandpass impedance $Z_{in,RF}\{\omega_{LO}+\Delta\omega\}$ at $V_{in}$, enabling the input matching and frequency-translated bandpass filtering, after which the BB signal at $V_x$ is up-converted to $V_{in}$ before being down-converted back to $V_x$ by a $-g_{m,CS}$ stage and $M_{A[0]}$.

12. The receiver as set forth in claim 1, wherein the plurality of parallel feedforward N-path passive mixers operate as a current-sensing path and the plurality of parallel N-path active mixers operate as a voltage-sensing path to perform the noise cancelling.

13. The receiver as set forth in claim 1,
wherein the BB-only two-stage HR amplifier has a first stage and a second stage,
the first stage having three sets of signals, each set having three signals 45 degrees apart $\{V_{BB[0]}:V_{BB[1]}:V_{BB[2]}\}$, $\{V_{BB[1]}:V_{BB[2]}:V_{BB[3]}\}$, and $\{V_{BB[2]}:V_{BB[3]}:V_{BB[4]}\}$, with a weighting ratio of $\{2:3:2\}$, and the second stage being arranged to generate three new signals 45 degrees apart $\{V_{H1[0]}:V_{H1[1]}:V_{H1[2]}\}$, which are then weighted again by a weighting ratio of $\{5:7:5\}$ to reproduce the desired gain ratio $\{1:\sqrt{2}:1\}$ for harmonic cancellation.

14. The receiver as set forth in claim 13, wherein a PMOS-input amplifier produces the weighting ratio of $\{2:3:2\}$ and an NMOS-input amplifier produces the weighting ratio of $\{5:7:5\}$.

15. The receiver as set forth in claim 13, wherein the BB-only two-stage HR amplifier minimizes total relative gain error by adding a relative gain error of the front end with a relative gain error of the first stage resulting in a sum that is multiplied by a relative gain error of the second stage resulting in a product that is divided by four.

16. The receiver as set forth in claim 1, wherein the receiver covers 0.15 to 0.85 GHz.

17. A single-ended-input current-reuse wideband receiver, comprising:
a stacked RF-to-BB front end adapted to receive an RF signal and having:
parallel N-path active mixer means for processing the RF signal by performing amplification, harmonic-recombination down-conversion, and baseband (BB) filtering on the RF signal in a single combined cell to generate an N-phase BB signal;
parallel feedforward N-path passive mixer means for performing input impedance matching, frequency-translated bandpass filtering, input biasing, and noise cancelling on the generated N-phase BB signal;
single-MOS pole-zero lowpass filter (LPF) means to filter the N-phase BB signal and having a lowpass input impedance for high stopband rejection at low voltage headroom consumption; and
BB-only two-stage harmonic-recombination (HR) amplifier means for performing two-step harmonic recombination of the filtered N-phase BB signal to enhance third and fifth harmonic rejection ratios without any gain scaling, performing BB current-to-voltage conversion and generating final differential BB I/Q outputs.

18. The receiver as set forth in claim 17, wherein N is 8.

19. The receiver as set forth in claim 17, wherein N is 4.

20. The receiver as set forth in claim 17, wherein the receiver has no components external to the single combined cell.

21. The receiver as set forth in claim 1, wherein N is 16.

* * * * *